United States Patent
Watanabe et al.

(10) Patent No.: US 10,461,241 B2
(45) Date of Patent: Oct. 29, 2019

(54) METHOD FOR MANUFACTURING RECTANGULAR PARALLELEPIPED-SHAPED SINGLE CRYSTAL, RECTANGULAR PARALLELEPIPED-SHAPED SINGLE CRYSTAL, METHOD FOR MANUFACTURING CERAMICS, CERAMICS, PIEZOELECTRIC ELEMENT, PIEZOELECTRIC DEVICE, AND ELECTRONIC DEVICE

(71) Applicant: CANON KABUSHIKI KAISHA, Tokyo (JP)

(72) Inventors: Takayuki Watanabe, Yokohama (JP); Shunsuke Murakami, Sheffield (GB); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 483 days.

(21) Appl. No.: 15/070,936

(22) Filed: Mar. 15, 2016

(65) Prior Publication Data

US 2016/0273125 A1 Sep. 22, 2016

(30) Foreign Application Priority Data

Mar. 17, 2015 (JP) .................................. 2015-054051

(51) Int. Cl.
*H01L 41/187* (2006.01)
*C30B 29/30* (2006.01)
(Continued)

(52) U.S. Cl.
CPC ............ *H01L 41/1873* (2013.01); *C30B 7/08* (2013.01); *C30B 29/30* (2013.01); *H01L 41/43* (2013.01)

(58) Field of Classification Search
CPC ........................ H01L 41/187; H01L 41/1873
(Continued)

(56) References Cited

U.S. PATENT DOCUMENTS

| 2010/0021728 A1* | 1/2010 | Kaigawa | ............ H01L 41/1873 428/338 |
| 2012/0064344 A1* | 3/2012 | Muramatsu | ............ B82Y 30/00 428/402 |
| 2015/0194594 A1* | 7/2015 | Murakami | ........... B41J 2/14233 347/68 |

FOREIGN PATENT DOCUMENTS

| CN | 101575209 A | 11/2009 |
| CN | 101805021 A | 8/2010 |

(Continued)

OTHER PUBLICATIONS

Cao, Minghe, et al., "Structure Control of NaNbO3 Template for Textured Ceramics Synthesized by Two-Step Molten Salt Method", Ferroelectrics, 2010, pp. 39-44, vol. 404.

(Continued)

*Primary Examiner* — Derek J Rosenau
(74) *Attorney, Agent, or Firm* — Canon U.S.A., Inc. IP Division

(57) ABSTRACT

This invention is a method for manufacturing a rectangular parallelepiped-shaped single crystal containing sodium niobate of a perovskite structure as the main component, and the method includes a process of heating a mixture 1 of bismuth sodium niobate which is formed from particles containing a plurality of crystals represented by General Formula (1): $Bi_{2.5}Na_{m-1.5}NbmO_{3m+3}$ (m is an integer of 2 or more) and in which an average value $m_a$ of the m values is larger than 6 and sodium containing alkali metal halide at 1200° C. or more and 1250° C. or less to obtain a rectangular parallelepiped-shaped single crystal containing sodium niobate as the main component.

8 Claims, 5 Drawing Sheets

(51) Int. Cl.
*C30B 7/08* (2006.01)
*H01L 41/43* (2013.01)

(58) Field of Classification Search
USPC .................. 310/358; 252/62.9 R, 62.9 PZ
See application file for complete search history.

(56) References Cited

FOREIGN PATENT DOCUMENTS

| | | | |
|---|---|---|---|
| CN | 102369162 A | 3/2012 | |
| CN | 103732539 A | 4/2014 | |
| CN | 104150535 A | 11/2014 | |
| CN | 104334498 A | 2/2015 | |
| WO | 2014/034692 A1 | 3/2014 | |

OTHER PUBLICATIONS

Poterala, Stephen F., et al., "Mechanistic Interpretation of the Aurivillius to Perovskite Topochemical Microcrystal Conversion Process", Chemistry of Materials, Feb. 4, 2010, pp. 2061-2068, vol. 22, No. 6, American Chemical society.
Ishii, Keisuke, et al., "Orientation Control of (K,Na)NbO3 Ceramics Using NaNbO3 Particles Prepared by Single-Step Molten Salt Synthesis", Japanese Journal of Applied Physics, Sep. 20, 2013, pp. 1-6, vol. 52.
Watanabe, Takayuki, et al., "Controlled Crystal Growth of Layered-Perovskite Thin Films as an Approach to Study Their Basic Properties", Journal of Applied Physics, Sep. 8, 2006, pp. 1-11, vol. 100.

\* cited by examiner

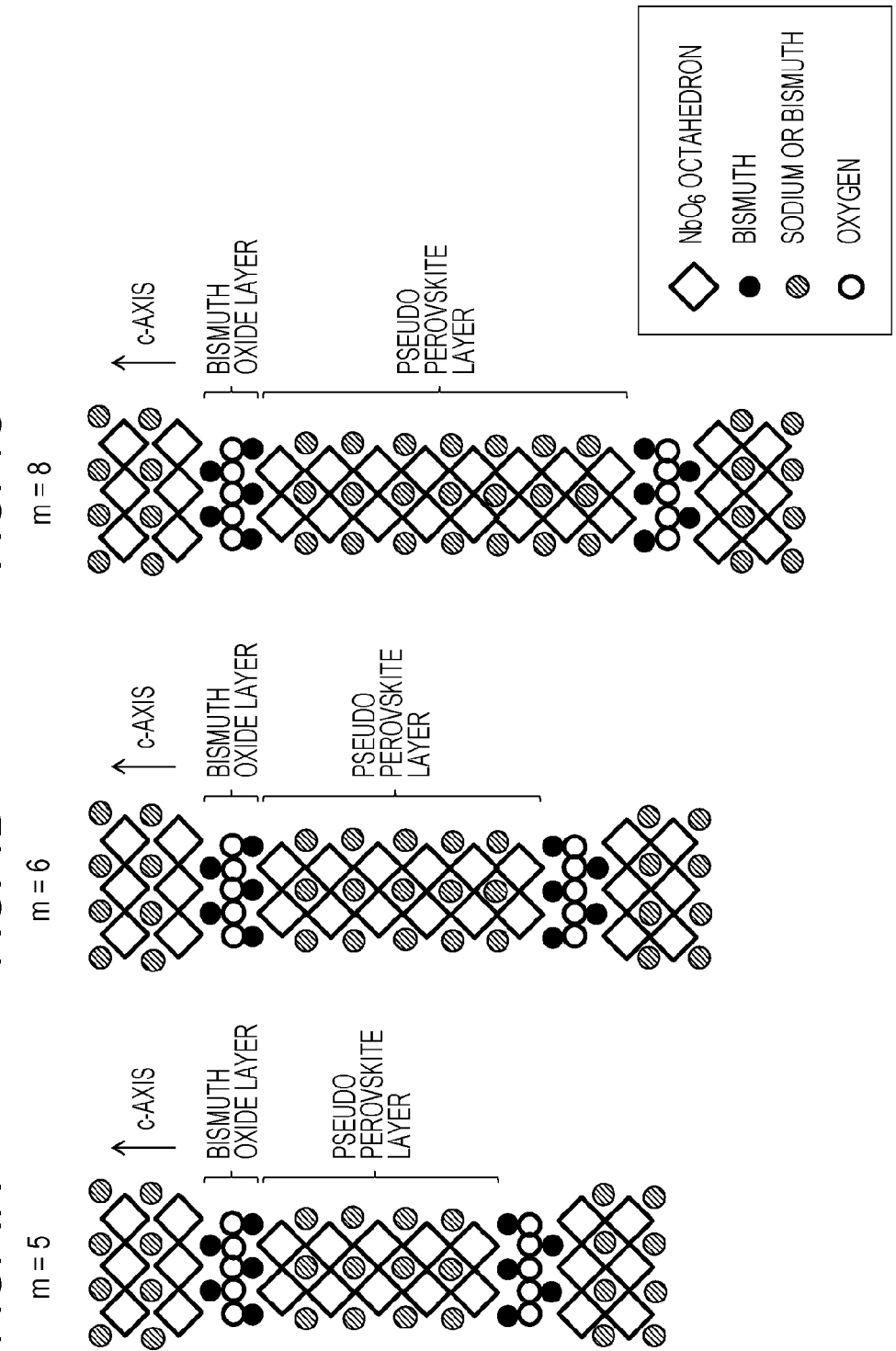

EXAMPLE 3

EXAMPLE 4

EXAMPLE 14

EXAMPLE 19

METHOD FOR MANUFACTURING RECTANGULAR PARALLELEPIPED-SHAPED SINGLE CRYSTAL, RECTANGULAR PARALLELEPIPED-SHAPED SINGLE CRYSTAL, METHOD FOR MANUFACTURING CERAMICS, CERAMICS, PIEZOELECTRIC ELEMENT, PIEZOELECTRIC DEVICE, AND ELECTRONIC DEVICE

BACKGROUND OF THE INVENTION

Field of the Invention

The present invention relates to a method for manufacturing a rectangular parallelepiped-shaped single crystal containing sodium niobate of a perovskite structure as the main component. The present invention also relates to a method for manufacturing a ceramics using a rectangular parallelepiped-shaped single crystal containing sodium niobate as the main component, the ceramics, a piezoelectric element, a piezoelectric device, and an electronic device.

Description of the Related Art

As template grains for use in manufacturing of an oriented piezoelectric ceramics containing sodium niobate of a perovskite structure as the main component, sodium niobate plate-like particles and sodium niobate rectangular parallelepiped-shaped single crystal are known.

As former template grains of sodium niobate, plate-like particles have been mainly used and have been manufactured by a two-step molten salt synthesis. "Ferroelectrics" (M. Cao et al., 2010, 404th volume, 39 page to 44 page) discloses a method for manufacturing sodium niobate plate-like particles by the two-step molten salt synthesis. Moreover, "Chemistry of Materials" (S. F. Poterala et al., 2010, 22th volume, 2061 page to 2068 page) discloses the mechanism that the plate-like particles manufactured by the two-step molten salt synthesis become a polycrystal.

Specifically, plate-like particles of a bismuth layer-structured compound produced first in the first stage of a synthesis process are rectangular parallelepiped crystals. However, a topochemical reaction involving the structural change from the bismuth layer structure to a perovskite structure, which occurs in the second stage of the synthesis process, progresses towards the inside from the front surface of the plate-like particles of the bismuth layer-structured compound which is an intermediate. Therefore, a liquid-phase boundary layer containing a large amount of bismuth is formed on the interface of a reacted portion of the plate-like particle surface and an unreacted portion inside the plate-like particles, and epitaxy is lost by the boundary layer. It is disclosed that, as a result, the plate-like particles do not become rectangular parallelepiped-shaped single crystals but become polycrystals.

In recent years, as the template grains of sodium niobate, those having a shape of a rectangular parallelepiped-shaped single crystal have drawn attention. "Japanese Journal of Applied Physics" (K. Ishii et al., 2013, 52th volume, 09KD04-1 page to 09KD04-6 page) discloses a method for manufacturing a rectangular parallelepiped-shaped single crystal of sodium niobate manufactured by a single-step molten salt synthesis. Specifically, it is disclosed that a platinum crucible filled with mixed powder of sodium carbonate, sodium chloride, niobium oxide, and bismuth oxide weighed into a predetermined molar ratio is held at 1225° C. for 12 hours, and then the obtained product is washed two or more times in warm water to remove the sodium chloride. Then, the by-product is removed through a 250 mesh sieve, whereby a rectangular parallelepiped-shaped single crystal of sodium niobate of a perovskite structure is obtained. According to the single-step molten salt synthesis described in "Japanese Journal of Applied Physics" (K. Ishii et al., 2013, 52th volume, 09KD04-1 page to 09KD04-6 page), in the formation of a rectangular parallelepiped-shaped single crystal of sodium niobate, the sodium niobate plate-like particles are produced via $Bi_{2.5}Na_{3.5}Nb_5O_{18}$ (m=5) which is a bismuth layer-structured compound as an intermediate in the same manner as in the former two-step molten salt synthesis. After the particles of the bismuth layer-structured compound which is an intermediate are formed, sodium niobate is generated by the topochemical reaction, and then a rectangular parallelepiped-shaped single crystal is obtained. The heat treatment process in the single-step molten salt synthesis is performed once and the acid washing is unnecessary. Furthermore, the grown rectangular parallelepiped-shaped single crystal has a smooth front surface.

The plate-like particles obtained by the two-step molten salt synthesis require performing heat treatment twice and an acid washing process for removing bismuth oxide. Furthermore, since the grown plate-like particles are polycrystals and the surface unevenness is large, the plate-like particles are not suitable as template grains for producing the oriented ceramics, and thus the plate-like particles have had various problems also from the viewpoint of industrial production and the viewpoint of the substance characteristics.

When the present inventors performed a supplementary examination referring to "Japanese Journal of Applied Physics" (K. Ishii et al., 2013, 52th volume, 09KD04-1 page to 09KD04-6 page) and then measured the composition of the obtained rectangular parallelepiped-shaped single crystal of sodium niobate. Then, the molar ratio of the sodium per mole of the niobium was less than 0.8 and greatly deviated from the stoichiometric ratio. This caused a problem that the composition of an oriented ceramics containing sodium niobate produced using the rectangular parallelepiped-shaped single crystals of sodium niobate produced by a single-step molten salt synthesis used heretofore as the template grain deviated from the stoichiometric ratio.

The present invention has been made in order to solve such problems and provides a method for manufacturing a rectangular parallelepiped-shaped single crystal containing sodium niobate as the main component having a perovskite structure and having a sodium deficiency amount to niobium of 20% or less, a method for manufacturing an oriented ceramics using the rectangular parallelepiped-shaped single crystal, and an oriented ceramics containing the same.

The present invention also provides a piezoelectric element, a piezoelectric device, and an electronic device containing the oriented ceramics.

SUMMARY OF THE INVENTION

The manufacturing method of the present invention which solves the problems described above is a method for manufacturing a rectangular parallelepiped-shaped single crystal containing sodium niobate of a perovskite structure as the main component, and the method includes a process of heating a mixture 1 of bismuth sodium niobate which is formed from particles containing a plurality of crystals of a composition represented by General Formula (1): $Bi_{2.5}Na_{m-1.5}NbmO_{3m+3}$ (m is an integer of 2 or more) and in which an average value ma of the m values in the particles is larger than 6 and sodium containing alkali metal halide at 1200° C. or more and 1250° C. or less to obtain a mixture 2 containing sodium niobate of a perovskite structure, and a process of removing a water soluble component from the mixture 2.

The rectangular parallelepiped-shaped single crystal of the present invention which solves the problems described above is a rectangular parallelepiped-shaped single crystal containing sodium niobate of a perovskite structure as the main component, in which the rectangular parallelepiped-shaped single crystal contains bismuth in an amount of 0.05 mol or more and 0.15 mol or less per mole of niobate, the Na/Nb ratio of the sodium niobate is 0.82 or more and 1.00 or less, and the ratio $L_{max}/L_{min}$ of the length of the longest side ($L_{max}$) to the length of the shortest side ($L_{min}$) of the rectangular parallelepiped is in the range of $4.0 \leq L_{max}/L_{min} \leq 8.5$.

The ceramics of the present invention is ceramics obtained by sintering a green body containing the rectangular parallelepiped-shaped single crystals.

The piezoelectric element of the present invention is a piezoelectric element having a first electrode, a piezoelectric material portion, and a second electrode, in which the piezoelectric material portion contains the ceramics described above.

The piezoelectric device of the present invention has the above-described piezoelectric element and has at least one of a voltage application unit to the piezoelectric element and a power extracting unit from the piezoelectric element.

The electronic device of the present invention is an electronic device having the piezoelectric element.

The present invention can provide a method for manufacturing a rectangular parallelepiped-shaped single crystal containing sodium niobate as the main component having a perovskite structure and having a sodium deficiency amount of 18% or less. Moreover, the present invention can provide a rectangular parallelepiped-shaped single crystal having a perovskite structure and containing sodium niobate as the main component. Furthermore, the present invention can provide a method for manufacturing an oriented ceramics using the rectangular parallelepiped-shaped single crystal and an oriented ceramics containing the same. Moreover, the present invention can provide a piezoelectric element and a piezoelectric device containing the oriented ceramics.

Further features of the present invention will become apparent from the following description of exemplary embodiments with reference to the attached drawings.

BRIEF DESCRIPTION OF THE DRAWINGS

FIGS. 1A to 1C are schematic views illustrating the crystal structures of $Bi_{2.5}Na_{3.5}Nb_5O_{18}$, $Bi_{2.5}Na_{4.5}Nb_6O_{21}$, and $Bi_{2.5}Na_{6.5}Nb_8O_{27}$ each having a bismuth layer structure, respectively. (Projection views from the a-axis direction in the bismuth layer structure) FIGS. 1A, 1B, and 1C are crystals of m=5, 6, and 8 having 5, 6, and 8 oxygen octahedrons along the c-axis in a pseudo perovskite layer, respectively.

DESCRIPTION OF THE EMBODIMENTS

Figure 2A:
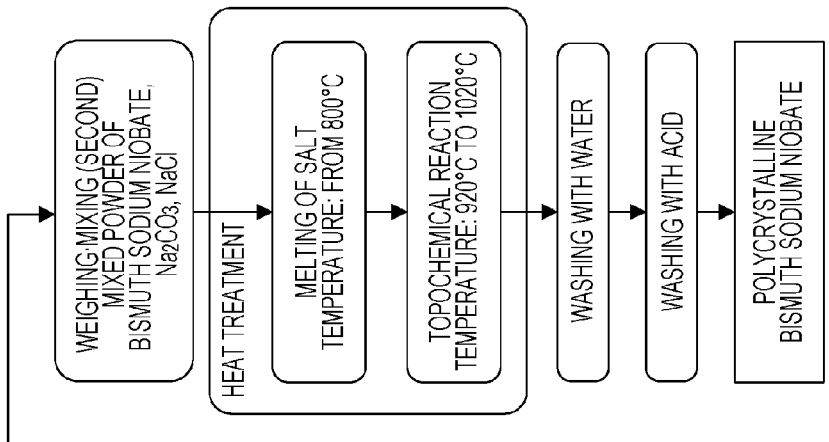
FIG. 2A illustrates a manufacturing flow of a rectangular parallelepiped-shaped single crystal of the present invention and FIG. 2B illustrates a manufacturing flow of a polycrystalline sodium niobate particles by a former two-stage molten salt synthesis.

Hereinafter, embodiments for carrying out the present invention are described.

Hereinafter, the molar ratio (sodium/niobium) of sodium per mole of niobium is referred to as a Na/Nb ratio and the Na/Nb ratio is sometimes used for the description as appropriate.

The present invention provides a method for manufacturing a rectangular parallelepiped-shaped single crystal containing sodium niobate of a perovskite structure as the main component. In the rectangular parallelepiped-shaped single crystal containing sodium niobate of a perovskite structure as the main component, element components, such as bismuth, are sometime contained.

The sodium niobate in the present invention has a perovskite structure ($CaTiO_3$ structure). According to Iwanami Rikagaku Jiten (Iwanami Dictionary of Physics and Chemistry), 5th edition, published by Iwanami Shoten, Feb. 20, 1998), metal oxides having the perovskite structure are generally represented by Chemical formula $ABO_3$. In the perovskite structure, the elements A and B occupy specific positions of unit cells referred to as an A site and a B site, respectively, in the form of an ion. For example, in the case of unit cells of a cubic crystal system, the A element is located at a vertex of the cube and the B element is located at the body center. The O elements occupy the face-centered position of the cubic as oxygen anions. The coordination number of the A site element is 12 and the coordination number of the B site element is 6. When the A element, the B element, and the O elements each slightly coordinate-shift from the symmetrical position of the unit cells, the unit cells of the perovskite structure are distorted to be crystal systems, such as a tetragonal crystal system, a rhombohedral crystal system, and an orthorhombic crystal system. The crystal system of the sodium niobate of the perovskite structure in the present invention is suitably the orthorhombic crystal system.

The rectangular parallelepiped-shaped single crystal of the present invention contains, as the main component, a rectangular parallelepiped-shaped single crystal containing sodium niobate of a perovskite structure. Herein, the main component means that a sodium niobate phase is larger than 50% and more preferably larger than 70% in the constituent phases of the rectangular parallelepiped-shaped single crystal. As the proportion of the sodium niobate phase in the rectangular parallelepiped-shaped single crystal, the rectangular parallelepiped-shaped single crystal is crushed, powder X-ray diffraction measurement is performed, and then the proportions of the constituent crystal phases can be determined. Also when the cross section of the rectangular parallelepiped-shaped single crystal is observed under a transmission electron microscope, the proportions can be evaluated. Electron diffraction patterns of a visual field observed at a low magnification (for example, 1000 times) are obtained, the diffraction resulting from the sodium niobate of the perovskite structure is selected, and then an image is formed by a dark field method. Then, a dark field image is obtained in which a portion of the sodium niobate of the perovskite structure is bright and a portion which does not contain the sodium niobate of the perovskite structure is dark. When the bright portion area within a visual field is larger than 50% or more, it can be judged that the sodium niobate of the perovskite structure is the main component of the rectangular parallelepiped-shaped single crystal.

The shape of the "rectangular parallelepiped shape" in the rectangular parallelepiped-shaped single crystal containing sodium niobate as the main component of the present invention means a parallelepiped shape containing a cube shape in which the lengths of the three sides are equal, when focusing on one particle. In the shape, the angle formed by a surface and a surface is in the range of 90°±10°. Particularly in the present invention, the rectangular parallelepiped shape refers to a so-called plate shape and also includes a shape in which the rectangular parallelepiped is partially chipped and a shape having a concavo-convex portion in any of the six surfaces. The principal surface (surface having the largest area) of the rectangular parallelepiped-shaped single crystal containing sodium niobate as the main component of the present invention is smooth and does not have a terrace including a step larger than 1 μm. The principal surface is parallel to the (110) plane or the (001) plane of the sodium niobate (The index of the sodium niobate having the perovskite structure is based on ICDD73-0803). Therefore, when the rectangular parallelepiped-shaped single crystal containing sodium niobate as the main component is placed on a smooth glass plate, and X-ray diffraction measurement (2θ-θ scan) is carried out, the intensities of 110 diffraction or 004 diffraction and higher order diffraction become relatively stronger than the other diffraction intensities. The shape characteristics of the rectangular parallelepiped-shaped single crystal can be distinguished by observing the rectangular parallelepiped-shaped single crystal under a scanning electron microscope or a transmission electron microscope. Since the rectangular parallelepiped-shaped single crystal is a plate shape, the crystal orientation can be controlled by tape casting typified by a rolling method and a doctor blade method.

The rectangular parallelepiped-shaped single crystal containing sodium niobate as the main component of the present invention is not a polycrystalline particle configured by aggregation of a plurality of single crystal particles. However, the rectangular parallelepiped-shaped single crystal of the present invention includes segregation and a small angle grain boundary of bismuth or bismuth oxide. Moreover, the rectangular parallelepiped-shaped single crystal of the present invention may include a domain structure generated by the phase transition from a cubic crystal phase to a low-symmetric phase (for example, tetragonal crystal phase and orthorhombic crystal phase). The rectangular parallelepiped-shaped single crystal of the present invention hardly contains a polycrystal having a large angle grain boundary. When an oriented piezoelectric ceramics is produced using the rectangular parallelepiped-shaped single crystal of the present invention as template grains, rectangular parallelepiped-shaped single crystal powder containing a plurality of rectangular parallelepiped-shaped single crystals is used. Therefore, when the rectangular parallelepiped-shaped single crystal powder is analyzed, the dimension, the aspect ratio, the composition, and the like are not completely uniform and have certain variations. Hereinafter, a description is given under the presumption that the rectangular parallelepiped-shaped single crystal containing sodium niobate as the main component of the present invention does not contain an epitaxial film joined to a substrate.

Manufacturing Method of this Embodiment

In the manufacturing method of this embodiment, bismuth sodium niobate is used which contains a plurality of crystals represented by General Formula (1): $Bi_{2.5}Na_{m-1.5}Nb_mO_{3m+3}$ (m is an integer of 2 or more) and in which the average value $m_a$ of the m values in the crystals is larger than 6. The m value is suitably 5 or more and 8 or less. The method further includes a process of heating a mixture 1 of the compound and sodium containing alkali metal halide at 1200° C. or more and 1250° C. or less to obtain a mixture 2 containing sodium niobate of the perovskite structure. The method further includes a process of removing water soluble components from the mixture 2.

The m value above represents the number of layers of oxygen octahedrons which are disposed so as to be continuous in the c-axis direction in the pseudo perovskite layer of a bismuth layer-structured compound. More preferably, the average value $m_a$ is 6.4 or more and 8.0 or less.

According to JOURNAL OF APPLIED PHYSICS, T. Watanabe et al., 2006, 100th volume, 051602 page, a bismuth layer-structured compound has a supperlattice structure in which a pseudo perovskite layer and a bismuth oxide layer are alternately laminated along the c-axis. On the other hand, the chemical formula of the crystal having the bismuth layer structure is generally represented by $(Bi_2O_2)^{2+}(A_{m-1}B_mO_{3m+1})^{2-}$. A in General Formula above is a monovalent, divalent, or trivalent ion, such as $Na^+$, $Sr^{2+}$, $Ba^{2+}$, $Pb^{2+}$, $Ca^{2+}$, or $Bi^{3+}$. B in General Formula above is a tetravalent, pentavalent, or hexavalent ion, such as $Ti^{4+}$, $V^{5+}$, $Ta^{5+}$, $Nb^{5+}$, $Mo^{6+}$, or $W^{6+}$. The m value in General Formula above is also a value representing the number of $BO_6$ octahedrons in the pseudo perovskite layer.

Bismuth sodium niobate which is one kind of a compound having the bismuth layer structure is represented by General Formula $Bi_{2.5}Na_{m-1.5}Nb_mO_{3m+3}$ (m is an integer of 2 or more). For example, $Bi_{2.5}Na_{3.5}Nb_5O_{18}$ is a material of m=5. When the chemical formula of the bismuth sodium niobate is made to correspond to the chemical formula of the crystal having the bismuth layer structure described above, the bismuth sodium niobate is represented by $(Bi_2O_2)^{2+}(Bi_{0.5/4}+Na_{3.5/4})_4Nb_5O_{16})^{2+}$.

FIGS. 1A to 1C each represent the crystal structures of the bismuth sodium niobate having the bismuth layer structure. FIG. 1A represents the crystal structure of $Bi_{2.5}Na_{3.5}Nb_5O_{18}$. FIG. 1B is a schematic view illustrating the crystal structure of $Bi_{2.5}Na_{4.5}Nb_6O_{21}$. FIG. 1C is a schematic view illustrating the crystal structure of $Bi_{2.5}Na_{6.5}Nb_8O_{27}$. (Projection views from the a-axis direction in the bismuth layer structure)

This compound has five oxygen octahedrons which are disposed so as to be continuous in the c-axis direction in the pseudo perovskite layer (FIG. 1A).

Herein, bismuth sodium niobates of m=5, 6, and 8 are represented by general formulae corresponding to General Formula $Bi_{2.5}Na_{m-1.5}Nb_mO_{3m+3}$, and listed below as examples.

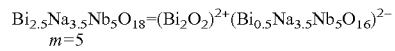
m=5

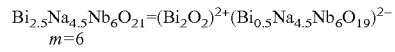
m=6

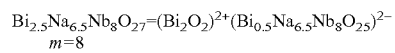
m=8

When represented as described above, it can be understood that an increase in the m value by 1 can be construed as an insertion of one layer of $NaNbO_3$ of the perovskite structure into the pseudo perovskite layer represented by $(A_{m-1}B_mO_{3m+1})^{-2}$.

Therefore, the m value can also be understood as the "Number of layers" of oxygen octahedron $NbO_6$ in the c-axis direction in the pseudo perovskite layer in the bismuth sodium niobate.

The rectangular parallelepiped-shaped single crystal containing sodium niobate of the perovskite structure as the main component is generated by a topochemical reaction via a compound of the bismuth layer structure which is an intermediate. The bismuth sodium niobate is equivalent to the compound of the bismuth layer structure as an intermediate in the present invention. The bismuth sodium niobate before the topochemical reaction has the form of a rectangular parallelepiped-shaped particle and is suitably a single crystal. The single crystal generally refers to one having not only a uniform crystallographic direction but a uniform composition in many cases. In powder containing rectangular parallelepiped-shaped single crystals of the bismuth sodium niobate of the present invention, however, the m values are not uniform inside the single crystals when focusing on each single crystal.

When focusing on the inside of the rectangular parallelepiped-shape single crystals of the bismuth sodium niobate, the crystallographic directions are uniform but the m values are not uniform and, more specifically, the compositions are not locally uniform. However, in the case where the a-axis and the b-axis of the bismuth sodium niobate are not distinguished. When the topochemical reaction completely progresses, the bismuth in the bismuth sodium niobate is completely discharged out of the crystal and simultaneously sodium is taken into the crystal, so that the molar ratio of the sodium to the niobium becomes 1:1, and thus the structural change from the bismuth layer structure to the perovskite structure is involved.

In practice, it is difficult to completely advance the topochemical reaction. In order to completely advance the topochemical reaction, it is imagined to increase the topochemical reaction temperature, lengthen the reaction time, and the like. With such an approach, a salt for use in the molten salt synthesis is evaporated at a high temperature to be lost or particles are sintered, and therefore it is difficult to completely advance the topochemical reaction. Accordingly, it is difficult to obtain a rectangular parallelepiped-shaped single crystal in which the Na/Nb ratio is 1, and it is known that a rectangular parallelepiped-shaped single crystal in which sodium is remarkably deficient is likely to be obtained.

When the $m_a$ value which is the average value of the m values of the bismuth sodium niobate which is an intermediate is 6.0 or less, the Na/Nb ratio of the rectangular parallelepiped-shaped single crystal containing sodium niobate of the perovskite structure to be obtained as the main component has a value smaller than 0.82.

The Na/Nb ratio of the rectangular parallelepiped-shaped single crystal containing the sodium niobate is suitably 0.82 or more. This is because the case where, when an oriented ceramics is produced using single crystals having a Na/Nb ratio of less than 0.80 as template grains, the piezoelectricity decreases is considered.

For example, an oriented ceramics of $0.88NaNbO_3$-$0.12BaTiO_3$ which is a lead-free piezoelectric substance is produced using a rectangular parallelepiped-shaped single crystal containing sodium niobate having a Na/Nb ratio of less than 0.82 for 5 parts by weight of the raw material powder and matrix grains containing unshaped particles containing sodium niobate and barium titanate for 95 parts by weight thereof.

Even when it is supposed that sodium is not deficient in the matrix grains, sodium is deficient by more than 1% in terms of the raw material powder t the stoichiometry composition, and when the volatilization of sodium in the firing process occurs, the sodium deficiency amount further increases. Although it is assumed to compensate the sodium deficiency of the template grains by setting the composition of the matrix grains in such a manner that sodium is excessively contained, it is difficult to selectively supply sodium to a portion of the template grain. On the other hand, when the deficiency of sodium in the oriented ceramics is within 2%, the reduction in the piezoelectricity is negligibly small.

For the composition analysis of the oriented ceramics, a wavelength dispersive X-ray fluorescence spectrometer can be used. The element concentration of the oriented ceramics can be calculated by preparing some standard samples whose concentration is known by ICP analysis beforehand, and then creating the calibration curve of the element concentration and the fluorescence X-ray intensity.

In order to realize the composition ratio, the average value $m_a$ of the bismuth sodium niobate which is an intermediate in the present invention is suitably larger than 6.0 as described below.

In order to increase the Na/Nb ratio in the rectangular parallelepiped-shaped single crystal containing the sodium niobate as the main component to be close to 1, bismuth sodium niobate having a larger Na/Nb ratio may be used for the intermediate. For example, in the case of $Bi_{2.5}Na_{3.5}Nb_5O_{18}$ of m=5, the Na/Nb ratio is 0.7. However, in the case of $Bi_{2.5}Na_{4.5}Nb_6O_{21}$ of m=6, the Na/Nb ratio increases to 0.75. Therefore, by the use of bismuth sodium niobate having a larger average value $m_a$ as the intermediate, the amount of sodium to be taken in can be reduced, so that the Na/Nb ratio of the rectangular parallelepiped-shaped single crystal can be increased.

In order to evaluate the average value $m_a$ of the m values, the distribution of the m values (equivalent to the number of layers in the bismuth sodium niobate as described above) is first evaluated using a transmission electron microscope. Electron beams are made to enter from a direction perpendicular to the c-axis of the bismuth sodium niobate, and then the structure in the bismuth sodium niobate crystal is observed under a transmission electron microscope. The m values can also be directly evaluated from a lattice image and can also be estimated from the interlayer distance in the c-axis direction of the bismuth oxide layers. When the interlayer distance of the bismuth oxide layers is about 2.5 nm, the m value is 5. When the number of the $NbO_6$ oxygen octahedron layers increases by 1 or decreases by 1, the interval between the bismuth oxide layers is lengthened or shortened corresponding to the dimension (0.4 nm) in the c-axis direction of one oxygen octahedron (Refer to FIG. 1).

Therefore, the local number of layers m can be determined from the interlayer distance of the bismuth oxide layers in the c-axis direction of the bismuth sodium niobate.

On the other hand, the average value $m_a$ is the average value of the m values in a certain range. For the evaluation of the average value $m_a$, the average value $m_a$ needs to be calculated from the m values of crystals present in a range sufficiently longer than the c-axis length of the bismuth sodium niobate. In the case of the range of 50 to 80 nm along the c-axis direction of the bismuth sodium niobate, ten or more bismuth oxide layers are involved, and thus the range is suitable for the calculation of the $m_a$ value. For example, the m values of the bismuth sodium niobate present on about 54 nm straight line along the c-axis of the bismuth sodium niobate are evaluated with a transmission electron microscope. When 6 crystals of m=5, 9 crystals of m=6, and 3 crystals of m=8 are present in the about 54 nm range, the average value $m_a$ of the bismuth sodium niobate is 6. When the existence probability of the crystal of m=6 or 8 increases, the average value $m_a$ of the bismuth sodium niobate becomes large. According to "Ferroelectrics" (M. Cao et al., 2010, 404 volume, 39 page to 44 page), as bismuth sodium niobate having a single m value, bismuth sodium niobates of m=2, 4, 5, 6, and 8 are known.

Figure 2B:
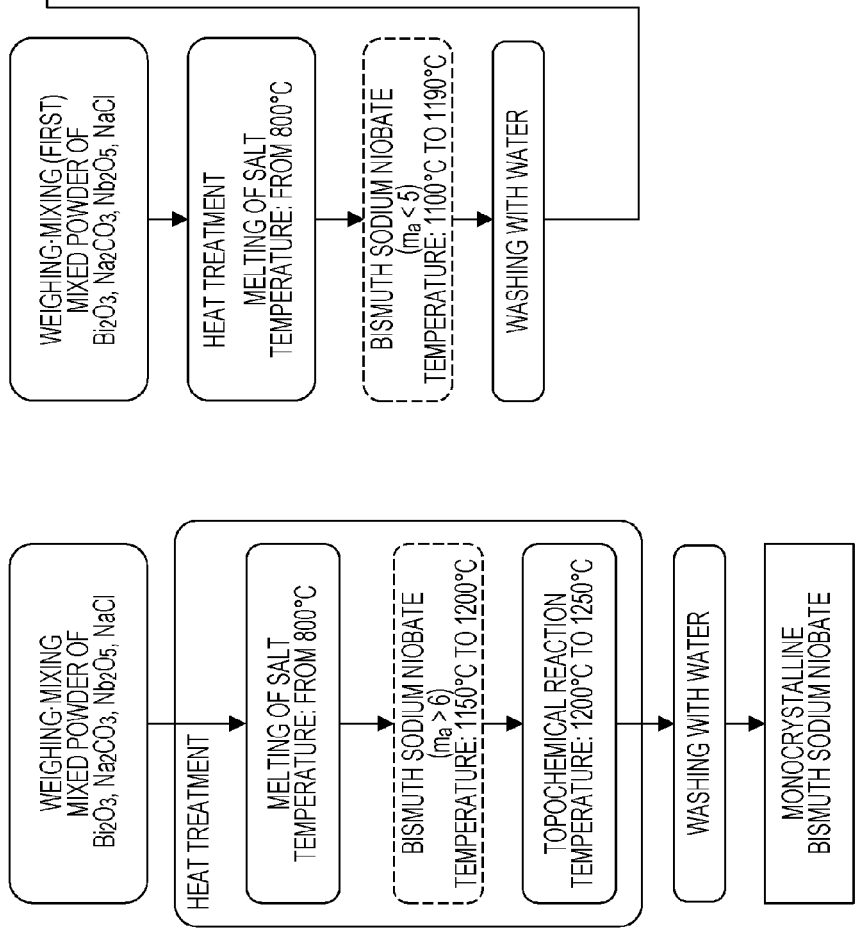

FIG. 2A illustrates the outline of the method for manufacturing a rectangular parallelepiped-shaped single crystal containing sodium niobate as the main component of the present invention. FIG. 2B illustrates the outline of the method for manufacturing sodium niobate particles by the former method described in "Ferroelectrics" (M. Cao et al., 2010, 404 volume, 39 page to 44 page) and the like. The heat treatment in the method for manufacturing a rectangular parallelepiped-shaped single crystal of the present invention is performed once.

Process of Obtaining Mixture 1

First, a mixture containing a niobium compound, a sodium compound, a bismuth compound, and sodium containing alkali metal halide is used as the raw material, and then the raw material is heated to increase the temperature to about 1150° C. to 1200° C. As a result of the heating, the sodium containing alkali metal halide is melted, and then a crystal is grown in the molten salt (molten salt synthesis). As a result, a mixture 1 of bismuth sodium niobate and the sodium containing alkali metal halide is obtained.

The heat treatment temperature of the present invention can be measured using a common thermal history sensor (Referthermo) manufactured by General Foundation Japan Fine Ceramics Center, Ltd. The Referthermo is placed at the position where a crucible is disposed in an electric furnace, and then the electric furnace is operated based on the temperature profile specified in the Referthermo. However, the Referthermo reacts with evaporated sodium chloride to be excessively contracted. Therefore, when measuring the temperature in the electric furnace, the raw material powder should not be placed in the electric furnace. When the temperature in the electric furnace and the set temperature of the electric furnace were measured using a Referthermo of Type L, the temperature in the furnace was in the range of Set value±3° C.

For the niobium compound, diniobium pentoxide ($Nb_2O_5$) can be used. For the sodium compound, sodium carbonate ($Na_2CO_3$) and sodium hydrogencarbonate ($NaHCO_3$) can be used. For the bismuth compound, dibismuth trioxide ($Bi_2O_3$) can be used. These compounds can be used as raw materials.

When the raw materials are mixed beforehand by wet mixing using ethanol, a reaction in which an intermediate is generated uniformly progresses, and thus such mixing is suitable.

It is desirable to mix the bismuth raw material, the sodium raw material, and the niobium raw material in such a manner that the molar ratio of each element is Bi:Na:Nb=2.5x:m−1.5:m (m is 6 to 8, x is 0.30 to 0.90). When the raw material components are adjusted in such a manner that the m value is less than 6, the average value $m_a$ does not become larger than 6.

Next, the value x relating to the composition ratio of the bismuth raw material is described. It is suitable that x is the number of less than 1 and x is 0.30 to 0.90. When x is 1, a rectangular parallelepiped-shaped single crystal cannot be obtained. More preferably, x is ⅓ (=0.33) or more and 0.60 or less. When x is less than ⅓, a large number of cubic particles having one side of about 1 μm are mixed in some case. On the other hand, when x is larger than 0.6, rectangular parallelepiped-shaped single crystals are aggregated to each other to form coarse particles in some cases. Although the cubic particles and the coarse particles can be removed by a sieve or decantation in any case, the yield of the rectangular parallelepiped-shaped single crystal decreases, and therefore both the cases are not industrially suitable.

The sodium containing alkali metal halide is used as the supply source of salt and sodium in the molten salt synthesis. The sodium containing alkali metal halide is at least one of sodium chloride, sodium fluoride, sodium bromide, and sodium iodide or a mixture of sodium halide and other alkali metal halides (for example, potassium fluoride, potassium chloride, potassium bromide, potassium iodide, lithium fluoride, lithium chloride, lithium bromide, and lithium iodide). In the case where a halide of potassium or lithium is used, the rectangular parallelepiped-shaped single crystal contains potassium and lithium, and therefore only sodium halide is used when these elements are to be removed. From the viewpoint of toxicity or cost, sodium chloride is suitably used for the sodium containing alkali metal halide.

Moreover, a salt with high solubility in water is easily removed by washing with water, and therefore the salt is still more suitable in terms of mining production.

Sodium chloride melts around 800° C. and the other raw materials are conveyed in liquid sodium chloride, so that the reaction between the raw materials is promoted. So to speak, in the "sea of sodium chloride", a crystal of the bismuth sodium niobate which is an intermediate is grown from the raw materials, so that the mixture 1 of the bismuth sodium niobate and the sodium chloride is obtained.

From the description above, when the molten salt synthesis is carried out, a sufficient amount of salt based on the raw materials needs to be present. With reference to the examples described above, when the amount of the sodium chloride which is the salt is excessively small, $Na_2CO_3$, $Bi_2O_3$, and $Nb_2O_5$ which are the raw materials of the bismuth sodium niobate cause a so-called solid-state reaction, so that plate-like particles are not grown.

When generating the bismuth sodium niobate which is an intermediate, the weight of the sodium containing alkali metal halide is suitably 1.0 times or more the total weight of niobium, sodium, and the bismuth compound which are the raw materials. When the weight of the sodium containing alkali metal halide is less than 1.0 times the weight of the raw materials, there is a possibility that a rectangular parallelepiped-shaped bismuth sodium niobate cannot be obtained. On the other hand, when the weight of the sodium containing alkali metal halide is excessively large, the ratio of the raw material powder of the bismuth sodium niobate which is an intermediate to the salt becomes smaller, and therefore the manufacturing efficiency is poor. Accordingly, such a weight of the sodium containing alkali metal halide is not suitable. The weight of the sodium containing alkali metal halide is 1.0 times or more and 10 times or less and preferably 1.0 times or more and 3.0 times or less the weight of the bismuth sodium niobate raw materials.

For example, when the total weight of the raw materials of the sodium bismuth niobate is set to 16 g and the sodium chloride weight is set to 40 g, the weight ratio of Salt/Raw materials is 2.5. When applied to the example of m=5 described above, the number of moles of the sodium chloride present therein is 100 times or more the number of the moles of the bismuth sodium niobate of the bismuth layer structure which is an intermediate. As a result, even when the sodium chloride is consumed in a topochemical reaction described below, it can become a sufficient supply source of sodium elements.

For a container for heating the mixture of the bismuth sodium niobate raw materials and the sodium containing alkali metal halide, various crucibles can be used. A crucible containing a material with few possibilities of causing a chemical reaction with the raw material powder of the bismuth sodium niobate is suitable and, for example, a platinum crucible can be used. In the case of using an inexpensive alumina crucible, since the alumina absorbs the bismuth, the amount of the bismuth in the bismuth sodium niobate raw materials needs to be adjusted according to the absorbing quantity of the crucible wall.

Process of Obtaining Mixture 2

A mixture 2 containing the sodium niobate having the perovskite structure is obtained by heating the mixture 1 of the bismuth sodium niobate and the sodium containing alkali metal halide at 1200° C. or more and 1250° C. or less.

The mixture 1 is held at a temperature of 1200° C. or more and 1250° C. or less for typically 30 minutes to at most 24 hours. Such heat treatment causes the topochemical reaction, so that a rectangular parallelepiped-shaped single crystal containing sodium niobate of the perovskite structure as the main component is obtained. For that end, it is necessary to hold the mixture 1 in a temperature range of 1200 to 1250° C. to give a certain amount of heat. When the temperature elevation rate to 1200° C. is remarkably low, the required holding time can be shortened.

By passing through such heat treatment, the structure of bismuth sodium niobate of the bismuth layer structure is changed to the sodium niobate of the perovskite structure. In order to cause the structural change, the heat treatment temperature is 1200° C. or more. However, when the temperature is higher than 1250° C., the sodium containing alkali metal halide evaporates, and thus the temperature is not suitable. The retention in a temperature range of 1200° C. or more and 1250° C. or less for 30 minutes to 12 hours is suitable. During the heat treatment, the temperature does not always need to be fixed and may gently increase. The range of the temperature elevation rate is preferably 5 to 20° C./hour and more preferably 10° C./hour. When the temperature is gently increased, the structural change gradually progresses, so that the generation of a non-rectangular parallelepiped-shaped single crystal can be suppressed.

Process of Obtaining Rectangular Parallelepiped-Shaped Single Crystal

After the heat treatment is completed, cooling is performed, and then water soluble components are removed from the obtained mixture 2. Specifically, by holding the crucible containing the mixture 2 in water for 1 to 3 hours, the water soluble components are dissolved out of the mixture 2. In order to promptly remove the water soluble components, it is suitable to perform stirring at a water temperature of 40° C. or more. In order to remove the water soluble components, this process is repeated several times while exchanging water (washing with water).

After removing the water soluble components, a solid remaining in the water is sieved in order to further remove unnecessary coarse particles. For example, a sieve with an opening of 50 to 200μ can be used. When fine particles are mixed, fine particles of 1 μm or less contained in a supernatant can be removed by decantation. By the processes above, the water soluble components, the coarse particles, and the fine particles are removed from the mixture 2, and a rectangular parallelepiped-shaped single crystal is obtained.

The bismuth in the rectangular parallelepiped-shaped single crystal can be reduced by washing the rectangular parallelepiped-shaped single crystal using hydrochloric acid or nitric acid as necessary but the process is not an indispensable process.

After the production of the mixture 1 of the bismuth sodium niobate and the sodium containing alkali metal halide, when heat treatment is continuously performed to the high-temperature mixture 1 by further heating the crucible without performing the cooling process, the process is simplified, and thus the process is suitable. In order to evaluate the average value $m_a$, the crucible is cooled when the temperature reached 1200° C. from 1150° C. at which the bismuth sodium niobate is formed. By removing the water soluble components in the crucible by washing with warm water, the bismuth sodium niobate particles are taken out, and then the $m_a$ value is evaluated.

Method for Producing Oriented Ceramics by Reactive Templated Grain Growth Method When the oriented ceramics is produced by a reactive templated grain growth method, a mixture of template grains having shape anisotropy and matrix grains which are smaller in size than the template grains and do not have shape anisotropy is produced. The mixture, a suitable plasticizer, binder, organic solvent, and the like are mixed to produce a slurry-like or clay-like material to be molded, and then a green body is produced by a doctor blade method or a rolling method. Since the template grains have shape anisotropy, the template grains are oriented in a specific direction in the green body by shearing force or the like applied to the material to be molded in the production process of the green body.

In the green body, the oriented template grains are dispersed and the circumference of the template grains is filled with the matrix grains. In general, the template grains have a plate shape and sometimes have a rectangular parallelepiped shape or a disk shape. When focusing on one template grain, the surface with the largest area thereof has an area of several micrometer-square or several tens of micrometer-square or an area equivalent thereto. The matrix grains have an infinite form and particles of about 100 nm to several hundreds of nm are used. When such a green body is fired, the grain growth succeeding the crystallographic direction information of the template grains occurs, so that the oriented ceramics is obtained.

The rectangular parallelepiped-shaped single crystal of the present invention contains bismuth in an amount of 0.05 mol or more and 0.15 mol or less per mole of niobium. Hereinafter, in the present invention, the molar ratio (Bismuth/Niobium) of the bismuth per mole of niobium of the sodium niobate is referred to as a Bi/Nb ratio. When the rectangular parallelepiped-shaped single crystal contains bismuth, the bismuth acts as an aid when producing the oriented ceramics using the rectangular parallelepiped-shaped single crystal containing sodium niobate as the main component as the template, and thus the crystal growth starting from the rectangular parallelepiped-shaped single crystal is promoted. A more preferable bismuth content is 0.05 mol or more and 0.10 mol or less.

When bismuth is contained in an amount of more than 0.15 mol, the bismuth diffused in the oriented ceramics has a bad influence as impurities on the characteristics of the oriented ceramics.

The rectangular parallelepiped-shaped single crystal containing sodium niobate as the main component of this embodiment has the following characteristics. More specifically, the value of the aspect ratio $L_{max}/L_{min}$ of the longest side length ($L_{max}$) to the shortest side length ($L_{min}$) of the rectangular parallelepiped is in the range of $4.0 \leq L_{max}/L_{min} \leq 8.5$.

When the $L_{max}$ is less than 4 in producing the oriented ceramics by a rolling method, it becomes difficult to control the orientation of the rectangular parallelepiped-shaped single crystal containing sodium niobate as the main component. Therefore, an oriented ceramics having a high orientation degree cannot be obtained.

In the case where the aspect ratio $L_{max}/L_{min}$ of the rectangular parallelepiped-shaped single crystal containing sodium niobate as the main component of the present invention becomes larger than 8.5, the shape anisotropy of the rectangular parallelepiped-shaped single crystal containing sodium niobate as the main component is large, and therefore the orientation control is easily achieved. On the other hand, the size of the rectangular parallelepiped-shaped single crystal containing sodium niobate as the main component becomes remarkably large, so that the sintering properties of the oriented ceramics decrease. When the weight ratio of the template grains to the matrix grains is fixed, the number of the rectangular parallelepiped-shaped single crystals containing sodium niobate as the main component to be added into the raw material powder further decreases with an increase in size of the rectangular parallelepiped-shaped single crystal containing sodium niobate as the main component. Therefore, the orientation degree of the oriented ceramics decreases. Accordingly, the aspect ratio $L_{max}/L_{min}$ is 4.0 or more and 8.5 or less. The $L_{max}/L_{min}$ is calculated by measuring the $L_{max}$ values and the $L_{min}$ values of the rectangular parallelepiped-shaped single crystal particles containing sodium niobate as the main component with a scanning electron microscope. The average value of the $L_{max}/L_{min}$ ratios is calculated from the $L_{max}/L_{min}$ ratios of 5 to 15 arbitrary rectangular parallelepiped-shaped single crystals containing sodium niobate as the main component. The average value of the $L_{max}/L_{min}$ ratios is also suitably within the same range as that mentioned above.

The $L_{max}$ of the rectangular parallelepiped-shaped single crystal is suitably 5 μm or more and 30 μm or less. When the $L_{max}$ is in this range, a high orientation degree can be achieved in the range where the density of the oriented ceramics is not reduced. A more preferable $L_{max}$ is 5 μm or more and 20 μm or less.

The $L_{min}$ value of the rectangular parallelepiped-shaped single crystal is suitably 1 μm or more and 4 μm or less. When the $L_{min}$ is value within the range mentioned above, a high orientation degree can be achieved in a range where the density of the oriented ceramics is not reduced.

Lotgering Factor: LGF

The orientation degree of the ceramics can be quantitatively evaluated by a Lotgering factor (LGF). As the calculation method of the Lotgering factor, the Lotgering factor is calculated by Expression 1 using the peak intensity of X-rays diffracted from the target crystal surface.

$$F=(\rho-\rho_0)/(1-\rho_0) \quad \text{(Expression 1)}$$

Herein, the $\rho_0$ is calculated using the diffraction intensity ($I_0$) of X-rays of a non-oriented ceramics sample. In the case of a (001)-oriented tetragonal crystal, the $\rho_0$ is determined by Expression 2 as the ratio of the total diffraction intensity of the (001) plane to the total diffraction intensity.

$$\rho_0=\Sigma I_0(001)/\Sigma I_0(hkl) \quad \text{(Expression 2)}$$

(h, k, and l are integers.)

The $\rho$ is calculated using the diffraction intensity (I) of X-rays of an oriented ceramic sample. In the case of a (001)-oriented tetragonal crystal, the $\rho_0$ is determined by Expression 3 in the same manner as Expression 2 as the ratio of the total diffraction intensity of the (001) plane to the total diffraction intensity.

$$\rho_0=\Sigma I(001)/\Sigma I(hkl) \quad \text{(Expression 3)}$$

In order to calculate the Lotgering factor as the index of the orientation degree of the ceramics, X-ray diffraction measurement employing a copper tube is performed, and then the intensity of the diffraction lines appearing in the range where 2θ is 20 to 70° is used for the calculation of the Lotgering factor.

An oriented ceramics can be produced by the use of the rectangular parallelepiped-shaped single crystal of the present invention. For example, when applied to a piezoelectric ceramics, an oriented piezoelectric ceramics having more excellent piezoelectric performance than that of a non-oriented piezoelectric ceramics can be provided.

A larger Lotgering factor is suitable because the electromechanical coupling factor of the oriented piezoelectric ceramics further increases. In the case of a crystal having the perovskite structure as the crystal structure and belonging to a tetragonal crystal system as in the $0.88NaNbO_3$-$0.12BaTiO_3$ described above, a (100)/(001)-oriented ceramics is obtained by the use of the rectangular parallelepiped-shaped single crystal of the present invention as the template grains. In the calculation of the Lotgering factor, the a-axis and the c-axis are not distinguished and the Lotgering factor is calculated as the ratio of the total diffraction intensity of the (h00) plane and the (001) plane to the total diffraction intensity. Similarly, in the case of a material of the perovskite structure belonging to the orthorhombic crystal system, the Lotgering factor is calculated as the ratio of the total diffraction intensity of the (h00) plane, the (0k0) plane, and the (001) plane to the total diffraction intensity.

Piezoelectric Element

Hereinafter, a piezoelectric element containing the oriented piezoelectric ceramics of the present invention is described.

Figure 5:
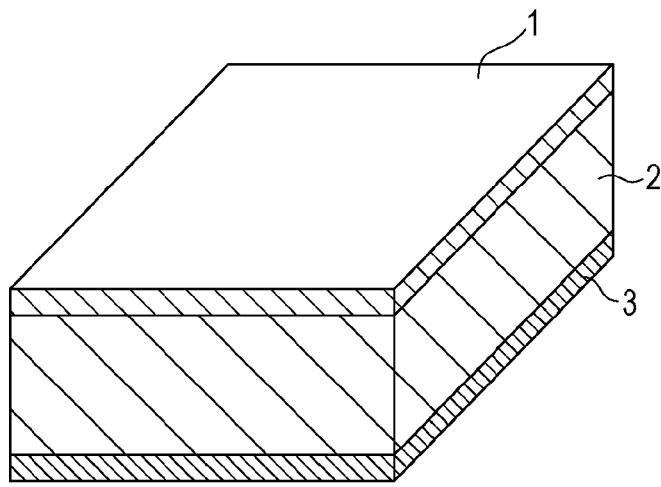
FIG. 5 is a schematic view illustrating one embodiment of the configuration of a piezoelectric element of the present invention.

FIG. 5 is a schematic view illustrating one embodiment of the configuration of the piezoelectric element of the present invention. The piezoelectric element according to the present invention is a piezoelectric element at least having a first electrode 1, a piezoelectric material portion 2 containing an oriented piezoelectric ceramics provided on the first electrode 1, and a second electrode 3 provided on the piezoelectric material portion, in which the piezoelectric material portion 2 is the oriented piezoelectric ceramics of the present invention.

The piezoelectric characteristics of the oriented piezoelectric ceramics according to the present invention can be evaluated by forming the same into a piezoelectric element at least having the first electrode and second electrode.

The first electrode and the second electrode contain electroconductive layers having a thickness of about 5 nm to 10 μm.

The materials are not particularly limited and those usually used for piezoelectric elements may be acceptable. For example, metals, such as Ti, Pt, Ta, Ir, Sr, In, Sn, Au, Al, Fe, Cr, Ni, Pd, Ag, and Cu, and compounds thereof can be mentioned. The first electrode and the second electrode may contain one kind thereof, may contain a mixture or an alloy of two or more kinds thereof, or may contain a laminate of two or more kinds thereof. The first electrode and the second electrode each may contain different materials.

A method for manufacturing the first electrode and the second electrode is not limited and the electrodes may be formed by baking a metal paste or may be formed by sputtering, a vapor-depositing method, or the like. Alternatively, both the first electrode and the second electrode may be patterned into a desired shape for use.

Polarization Processing

The piezoelectric element is more suitably one in which the polarization axes are uniformed in a fixed direction. Due to the fact that the polarization axes are uniformed in a fixed direction, the piezoelectric constant of the piezoelectric element becomes larger.

A polarization method of the piezoelectric element is not particularly limited. The polarization processing may be performed in the atmosphere or may be performed in silicone oil.

The temperature at which the polarization is performed is suitably a temperature of 60 to 150° C. However, the optimal conditions change depending on the composition of the oriented piezoelectric ceramics configuring the piezoelectric element.

An electric field to be applied in order to carry out the polarization processing, an electric field of 600 v/mm to 2.0 kV/mm is suitable.

The oriented piezoelectric ceramics of the present invention can be used for not only a liquid ejection head, a motor, and the like but piezoelectric devices, such as an ultrasonic transducer, a piezoelectric actuator, a piezoelectric sensor, a ferroelectric memory, and a power generator.

Figure 6A:
FIGS. 6A to 6C are schematic views illustrating one embodiment of a piezoelectric device of the present invention.
Figure 6B:
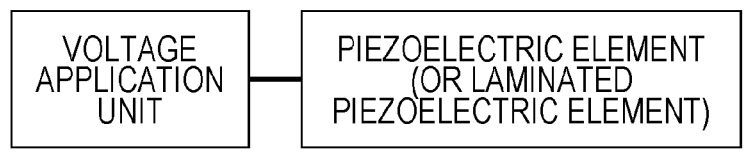
Figure 6C:

As illustrated in FIGS. 6A to 6C, the piezoelectric device of the present invention has the piezoelectric element of the present invention and has at least one of a voltage input unit and a power extracting unit to/from the piezoelectric element. The "power extraction" may be any of the action of extracting electric energy and the action of receiving an electric signal. Alternatively, as illustrated in FIG. 6C, the electronic device of the present invention may have a configuration having the piezoelectric element.

EXAMPLES

Hereinafter, the method for manufacturing a rectangular parallelepiped-shaped single crystal and the rectangular parallelepiped-shaped single crystal of the present invention are more specifically described with reference to Examples but the present invention is not limited to Examples described below.

Comparative Example 1

The synthesis of plate-like sodium niobate by a two-step molten salt synthesis is described below for comparison. In consideration of the description above, this comparative example is equivalent to the case of using bismuth sodium niobate equivalent to m=5 as bismuth sodium niobate represented by General Formula $Bi_{2.5}Na_{m-1.5}Nb_mO_{3m+3}$ (m is an integer of 2 or more).

First, bismuth oxide ($Bi_2O_3$), sodium carbonate ($Na_2CO_3$), and monoclinic niobium oxide ($Nb_2O_5$) each were weighed and mixed in such a manner that the ratio was 5:7:10 in terms of molar ratio. To the mixed powder, ethanol of a weight equal to the weight thereof was added to form a slurry, and then ball mill was carried out over 12 hours using zirconia balls 10 mm in diameter (wet mixing and pulverization). The zirconia balls were removed from the slurry, and then the slurry was dried to remove the ethanol. The dried mixed powder was passed through a sieve of an opening of 250μ to obtain raw material powder. Sodium chloride (NaCl) of a weight 2.5 times the weight of the raw material powder was added and mixed. Specifically, 40 g of sodium chloride was added to 16 g of the raw material powder.

The mixture of the raw material powder and the sodium chloride was charged into a platinum crucible with a capacity of 50 ml. The platinum crucible was similarly covered with a platinum lid. The temperature of the platinum crucible was increased at a speed of 300° C./hour from room temperature to 1100 to 1190° C. in an electric furnace, the crucible was held for 3 to 6 hours, and then the crucible was cooled to room temperature.

The platinum crucible taken out of the electric furnace was immersed in 80° C. distilled water (warm water), and then allowed to stand for about 3 hours to remove most of water soluble components. The product in the crucible was in the shape of plate-like particles which were not aggregated to each other and was able to be flown into warm water from the crucible. When the product adhered to the inside of the platinum crucible, water was sprayed thereto using a syringe or the like to cause a residue to flow into warm water. In order to further remove the water soluble components, the product was precipitated on the container bottom, the supernatant of the warm water was discarded, new warm water was added to the container, and then stirring was performed for 3 hours or more using a stirrer with a propeller. After the stirring, the moisture was evaporated to obtain intermediate plate-like particles having a bismuth layer structure.

In order to estimate the number of moles of the obtained intermediate plate-like particles, the number of moles of the intermediate plate-like particles was calculated assuming that all the intermediate plate-like particles were represented by $Bi_{2.5}Na_{3.5}Nb_5O_{18}$. Sodium carbonate ($Na_2CO_3$) whose number of moles was 1.3 times the number of moles of the intermediate plate-like particles was added. Furthermore, to the mixed powder of the intermediate plate-like particles and the sodium carbonate, sodium chloride of a weight 1.5 times the weight thereof was added, and then the mixture was charged into the platinum crucible. The crucible was heated to 920 to 1020° C. in an electric furnace, and then held for 3 to 6 hours (heat treatment). After cooling, the product was washed with warm water in the same manner as in the production of the intermediate plate-like particles (washing with water) to remove the water soluble components, and then immersed in dilute hydrochloric acid for 12 hours to remove the bismuth oxide (acid washing). The washing with warm water and the acid washing process described above were carried out again.

The particles obtained by removing the water soluble components and the bismuth oxide from the product were plate-like particles. The constituent phase of the plate-like particles was evaluated by X-ray diffraction to be sodium niobate of a perovskite structure. Moreover, when the obtained plate-like particles were observed using a scanning electron microscope, a large number of particles which did not have a parallelepiped shape, in which the angle formed by a surface and a surface is in the range of 90°±10°, were observed. When the plate-like particles were observed in more detail under a transmission electron microscope, it was found that the plate-like particles are aggregates (polycrystal) of thinner plate-like crystals and were not single crystals.

Comparative Example 2

Although Comparative Example 2 is similar to Comparative Example 1, the synthesis of plate-like sodium niobate by a two-stage molten salt synthesis in the case of m=8 is next described in Comparative Example 2.

Bismuth oxide ($Bi_2O_3$), sodium carbonate ($Na_2CO_3$), and monoclinic niobium oxide ($Nb_2O_5$) each were weighed and mixed in such a manner that the ratio was 5:13:16 in terms of molar ratio. Then, plate-like particles were obtained by using the same technique as that of Comparative Example 1 as the subsequent procedure. The plate particles did not have a rectangular parallelepiped-shape similarly as in Comparative Example 1. When the plate-like particles were observed under a scanning electron microscope, the plate-like particle surface had a step of 1 µm or more. It was found that the plate-like particles were aggregates in which thinner plate-like crystals were connected to be continuous in the form of a layer and were not single crystals.

Hereinafter, the synthesis of a rectangular parallelepiped-shaped single crystal by a one-stage molten salt synthesis is described.

First, bismuth oxide ($Bi_2O_3$), sodium carbonate ($Na_2CO_3$), and monoclinic niobium oxide ($Nb_2O_5$) each were weighed in such a manner that the ratio was Ax:B:C in terms of molar ratio, and then a rectangular parallelepiped-shaped single crystal was synthesized. The Ax represents the multiplication of the charge amount ratio x to the stoichiometric ratio A. x is the number between 0 and 1. For example, in the case of A=5 and x=0.3, Ax was 1.5.

When x is 1, the raw material composition is equal to the stoichiometry composition of bismuth sodium niobate, and thus the structural change to sodium niobate of the perovskite structure is hard to progress. In order to promote the topochemical reaction, x was set to be smaller than 1. With respect to Comparative Examples 3 to 8 and Examples 1 to 21, the molar ratio of the raw material powder, the used salt, the weight ratio of the raw materials and the salt, the heat treatment temperature, the heat treatment time, and the material of the used crucible were collectively shown in Table 1. The temperature profile of the crucible in the one-stage molten salt synthesis of this example includes a process of increasing the temperature at a fixed speed from room temperature to the heat treatment temperature, a process of holding the crucible for a certain period of time at the heat treatment temperature, and then cooling the crucible in a furnace to room temperature. With respect to Comparative Example 3 and Examples 3 and 17 described below, the Na/Nb ratio and the Bi/Nb ratio of the rectangular parallelepiped-shaped single crystals and the $m_a$ values of the bismuth sodium niobate measured by ICP analysis were shown in Table 2. With respect to Comparative Example 3 and Examples 2, 3, 16, and 17, the $L_{max}$, $L_{min}$, and the aspect ratio $L_{max}/L_{min}$ measured with a scanning electron microscope are shown in Table 3.

Comparative Example 3

Plate-like sodium niobate particles were produced by a former one-stage molten salt synthesis. This comparative example is equivalent to the case of m=5.

Bismuth oxide ($Bi_2O_3$), sodium carbonate ($Na_2CO_3$), and niobium oxide ($Nb_2O_5$) each were weighed and mixed in such a manner that the ratio was 5x:7:10 (x=⅓) in terms of molar ratio. To the mixed powder, ethanol of a weight equal to the weight thereof was added to form a slurry shape, and then ball mill was carried out over 12 hours using zirconia balls 10 mm in diameter (wet mixing and pulverization). The zirconia balls were removed from the slurry, and then the slurry was dried to remove the ethanol. The dried mixed powder was passed through a sieve of an opening of 250µ to obtain raw material powder. To the raw material powder, sodium chloride (NaCl) of a weight 2.5 times the weight thereof was added and mixed. Specifically, 40 g of sodium chloride was added to 16 g of the raw material powder.

The mixture of the raw material powder and the sodium chloride was charged into a platinum crucible with a capacity of 50 ml. The platinum crucible was similarly covered with a platinum lid. The temperature of the platinum crucible was increased at a speed of 300° C./hour from room temperature to 1225° C. in an electric furnace, the crucible was held at the temperature for 6 hours, and then the crucible was cooled to room temperature.

The platinum crucible taken out of the electric furnace was immersed in 80° C. distilled water (warm water), and then allowed to stand for about 3 hours. Then, the platinum crucible was taken out of the warm water. When the product adhered to the inside of the platinum crucible, water was sprayed thereto using a syringe or the like to cause a residue to flow into warm water. The product was precipitated on the container bottom, the supernatant of the warm water was discarded, new warm water was added to the container, and then stirring was performed for 3 hours or more using a stirrer with a propeller. After the stirring, the container was allowed to stand again to precipitate the product. The supernatant of the warm water was discarded, new warm water was added to the container, and then stirring was performed for 3 hours or more using a stirrer with a propeller.

After the second stirring, coarse particles were removed by passing the product with the warm water through a mesh having an opening of 71µ. Furthermore, decantation was performed 2 to 3 times using distilled water to remove fine particles with a slow precipitation rate contained in the supernatant. Thereafter, the distilled water was evaporated to obtain plate-like particles.

When the plate-like particles were evaluated using a scanning electron microscope and a transmission electron microscope, the plate-like particles were rectangular parallelepiped-shaped single crystals containing sodium niobate as the main component (80% or more). However, the Na/Nb ratio and the Bi/Nb ratio were 0.77 and 0.11, respectively, as measured by ICP analysis.

Moreover, in order to evaluate the average value ma, the heating was interrupted immediately after the temperature reached 1200° C., and then the product in the crucible was taken out according to the procedure described above. When the product was observed under a scanning electron microscope, the product was formed from plate-like particles. When the cross section of the plate-like particles was observed under a transmission electron microscope, the plate-like particles were formed from bismuth sodium niobate. When the interlayer distance of the bismuth oxide layers was measured to calculate the $m_a$ value, the m values were distributed in the range of 5 to 8 and the average value $m_a$ thereof was 6. When the rectangular parallelepiped-shaped single crystal of Comparative Example 3 was observed under a scanning electron microscope, the $L_{max}$ values of randomly selected 6 single crystals were 13 µm or more and 17.5 µm or less and the $L_{min}$ values thereof were 4.1 μm or more and 5.5 μm or less. The aspect ratios ($L_{max}/L_{min}$) were 3.0 to 3.9 and the average value was 3.4.

Examples 1 to 4

In consideration of the comparative examples described below, Examples according to this embodiment are described in order.

Examples 1 to 4 are equivalent to the case of Average value $m_a>6$.

Bismuth oxide ($Bi_2O_3$), sodium carbonate ($Na_2CO_3$), and niobium oxide ($Nb_2O_5$) each were weighed and mixed in such a manner that the ratio was 5x:9:12 (x=0.6, 0.5, 0.4, 0.3) in terms of molar ratio. Then, plate particles were obtained by the same procedure as that of Comparative Example 3.

In Example 1, x was 0.6, i.e., the molar ratio of bismuth oxide ($Bi_2O_3$) was 3.0.

The plate-like particles obtained when x was 0.4 to 0.6, i.e., from the samples of Examples 1, 2, and 3, were formed from sodium niobate which was a rectangular parallelepiped-shaped single crystal. When the composition of the rectangular parallelepiped-shaped single crystal of Example 3 was evaluated by ICP analysis, the Na/Nb ratio was 0.82 and the Bi/Nb ratio was 0.095. The values showed that the deficiency degree of Na to Nb was lower than that of Comparative Example 3, and thus Example 3 was suitable.

The average value $m_a$ was verified for Examples 1 to 4. The heating was interrupted immediately after the temperature reached 1200° C., the particles in the crucible were taken out according to the procedure described in Comparative Example 3, and then the cross section was observed. Then, the product was formed from plate-like bismuth sodium niobate. The interlayer distance of the bismuth oxide layers was measured by a transmission electron microscope, and the average value $m_a$ was calculated. In the bismuth sodium niobate particles, various particles having the m values in the range of 5 to 8 were found. The average value $m_a$ thereof was 6.4.

When the rectangular parallelepiped-shaped single crystals of Example 2 were observed under a scanning electron microscope, the $L_{max}$ values of 8 single crystals were 12.9 μm to 18.0 μm and the $L_{min}$ values were 2.9 μm to 3.9 μm. The aspect ratios ($L_{max}/L_{min}$) were 4.2 to 5.5 and the average value was 4.8.

When the rectangular parallelepiped-shaped single crystals of Example 3 were observed under a scanning electron microscope, the $L_{max}$ values of 11 single crystals were 12.1 μm to 20.0 μm and the $L_{min}$ values were 2.2 μm to 3.7 μm. The aspect ratios ($L_{max}/L_{min}$) were 4.4 to 7.1 and the average value was 5.7.

The $L_{min}$ values of Examples 2 and 3 were as small as less than 4 μm and the $L_{max}/L_{min}$ values and the average value thereof were as large as 4 or more as compared with the values of the sample of Comparative Example 3.

The Na/Nb ratio and the Bi/Nb ratio of the sample of Example 3 were 0.82 and 0.095, respectively, as measured by ICP analysis.

Figure 3:
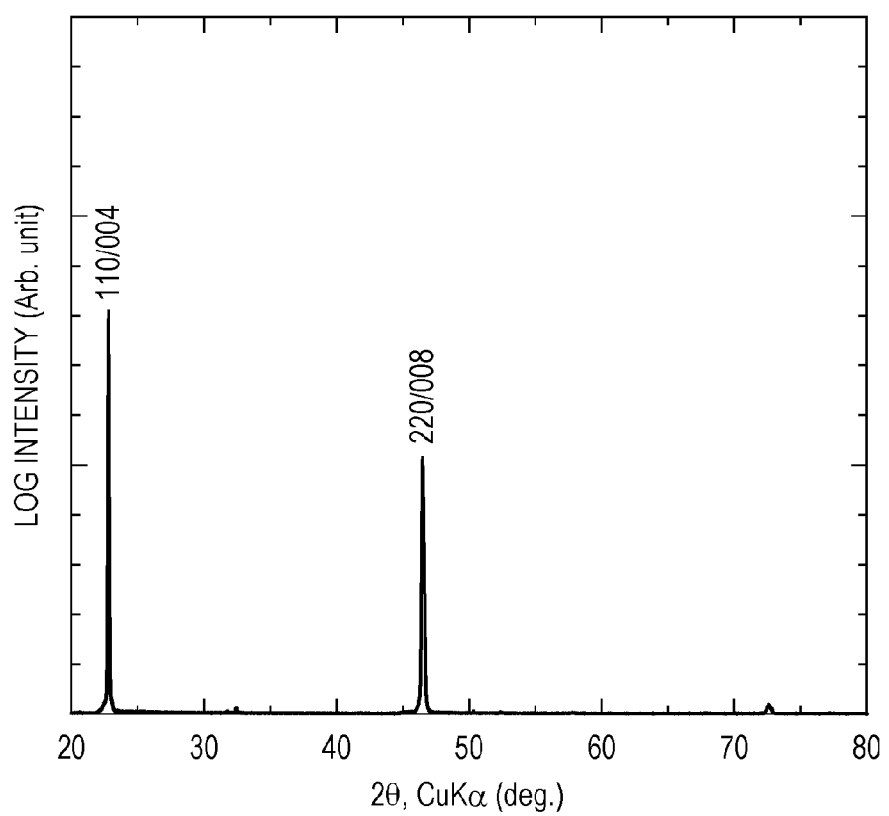
FIG. 3 is an X-ray diffraction view of a rectangular parallelepiped-shaped single crystal of Example 3 of the present invention.
Figure 4A:
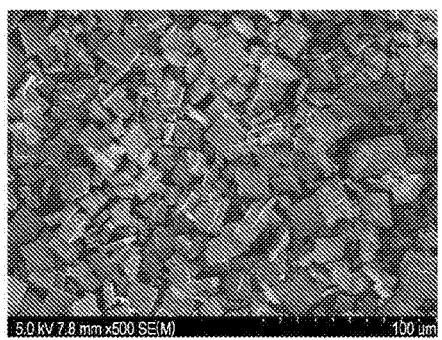
FIGS. 4A to 4D are scanning electron micrographs of rectangular parallelepiped-shaped single crystals of Examples 3, 4, 14, and 19 of the present invention.
Figure 4B:
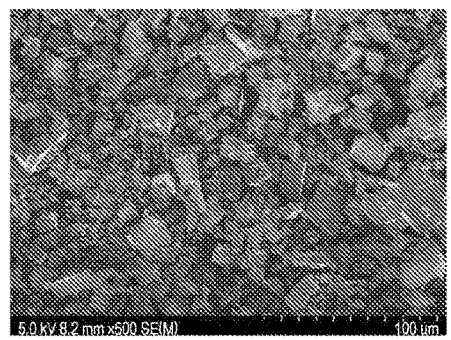
Figure 4C:
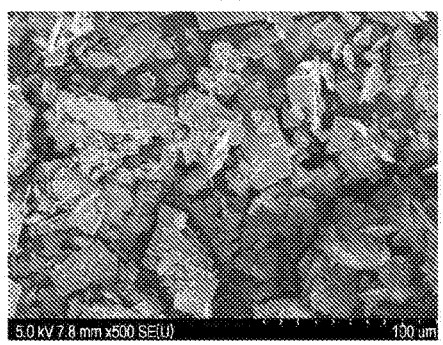
Figure 4D:
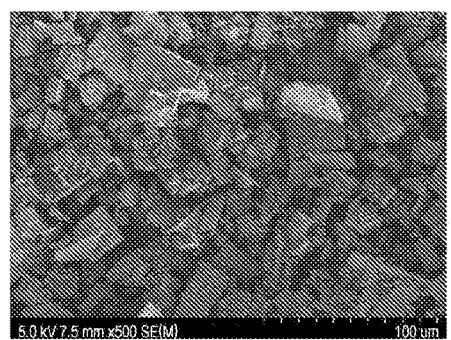

The rectangular parallelepiped-shaped single crystal was cast into a glass plate shape, and then X-ray diffraction was carried out. Then, only the hh0 diffraction and the 00l diffraction (h and l are natural numbers) of sodium niobate of the perovskite structure were observed. Furthermore, it was found that the largest are surface was the (110) plane or the (001) plane. The results were shown in FIG. 3.

When x was 0.3 (Example 4), the rectangular parallelepiped-shaped single crystal of the present invention was obtained but cubic sodium niobate particles of 5 μm or less were simultaneously mixed. Since the cubic particles are smaller than rectangular parallelepiped-shaped particles, the cubic particles can be removed by classification and have no problems in practical use. However, the yield of the rectangular parallelepiped-shaped single crystal containing sodium niobate as the main component in Example 4 was lower than that of Examples 1 to 3.

Examples 5 to 8

These examples are equivalent to the case of Average value $m_a>6$. In producing a rectangular parallelepiped-shaped single crystal containing sodium niobate as the main component, the heat treatment temperature dependency was investigated as follows. A rectangular parallelepiped-shaped single crystal containing sodium niobate as the main component was produced by the same technique as that of Example 3, except the holding temperature. Even when the holding temperature was changed in the range of 1200 to 1235° C., a rectangular parallelepiped-shaped single crystal was able to be obtained.

Comparative Example 4

The holding temperature was lower than the temperatures of Examples 5 to 8 and was set to 1150° C. A rectangular parallelepiped-shaped single crystal was produced by the same technique as that of Examples 5 to 8, except lowering the holding temperature as compared with the holding temperatures of the samples of Examples 5 to 8. In the obtained particles, bismuth sodium niobate was the main phase, and thus the obtained particles were not suitable.

Example 9

This example is equivalent to the case of Average value $m_a>6$.

A rectangular parallelepiped-shaped single crystal was produced by the same technique as that of Example 3, except using a mixture obtained by adding 10% by weight of sodium fluoride to 90% by weight of sodium chloride as sodium containing alkali metal halide as a salt. Even when the salt was a mixture of sodium chloride and sodium fluoride, a rectangular parallelepiped-shaped single crystal containing sodium niobate as the main component was able to be obtained.

Examples 10 and 11, Comparative Example 5

Rectangular parallelepiped-shaped single crystals containing sodium niobate as the main component were produced by the same technique as that of Example 3, except setting the weight of sodium chloride to 1.5 times, 1.0 times, and 0.5 times the weight of raw material powder. Even when the weight ratio of the salt to the raw material powder was 1.0 or 1.5 times, a rectangular parallelepiped-shaped single crystal containing sodium niobate as the main component was able to be obtained but, when the weight ratio was 0.5 times (Comparative Example 5), a rectangular parallelepiped-shaped single crystal containing sodium niobate as the main component was not able to be obtained.

Example 12, Comparative Example 6

The reaction time to the topochemical reaction occurring in the heat treatment process was compared and examined as follows. Rectangular parallelepiped-shaped single crystals were produced by the same technique as that of Example 3, except setting the holding time at 1225° C. to 12 hours (Example 12) and 0 hour (Comparative Example 6, in which a crucible was heated from room temperature, and then cooling was started immediately when the temperature reached 1225° C.). In Example 12 in which the holding time at 1225° C. was 12 hours, a rectangular parallelepiped-shaped single crystal containing sodium niobate as the main component was able to be obtained as in Example 3. On the other hand, in Comparative Example 6 in which the holding time was 0 hour, a rectangular parallelepiped-shaped single crystal containing sodium niobate of a perovskite structure as the main component was not able to be obtained.

Example 13

A rectangular parallelepiped-shaped single crystal was produced by the same technique as that of Example 3, except using not a platinum crucible but an alumina crucible (unused) and except the fact that the molar ratio of the bismuth raw material to the sodium raw material and the niobium raw material was large. Even when the material of the crucible was changed into alumina having a property of absorbing bismuth, a rectangular parallelepiped-shaped single crystal containing sodium niobate as the main component was able to be obtained when the amount of the bismuth in the starting raw material was adjusted to be larger.

Examples 14 to 19

The examples are equivalent to the case of Average value ma>6.

Bismuth oxide ($Bi_2O_3$), sodium carbonate ($Na_2CO_3$), and monoclinic niobium oxide ($Nb_2O_5$) each were weighed and mixed in such a manner that the ratio was 5x:13:14 (x=0.8 to 0.3) in terms of molar ratio. For example, in Example 14, x is 0.80, and thus the molar ratio of bismuth oxide ($Bi_2O_3$) is 4.0 and the molar ratio of bismuth oxide of Example 15 is 3.5.

Then, a rectangular parallelepiped-shaped single crystal was produced by the same technique as that of Example 3. When x was 0.4 to 0.6, the obtained plate-like particles were formed from sodium niobate which was a rectangular parallelepiped-shaped single crystal.

When the composition of the rectangular parallelepiped-shaped single crystal containing sodium niobate as the main component of Example 17 was evaluated by ICP analysis, the Na/Nb ratio was 0.87 and the Bi/Nb ratio was 0.11. When the interlayer distance of the bismuth oxide layers was measured by a transmission electron microscope to calculate the average value ma, the m values were distributed in the range of 5 to 8 and the average value ma thereof was about 7.

When the rectangular parallelepiped-shaped single crystals of Example 16 were observed under a scanning electron microscope, the $L_{max}$ values of randomly selected 5 single crystals were 11.1 µm or more and 15.2 µm or less and the $L_{min}$ values thereof were 1.8 µm or more and 3.1 µm or less. The aspect ratios ($L_{max}/L_{min}$) were 4.3 to 7.3 and the average value was 5.6. When the rectangular parallelepiped-shaped single crystals of Example 17 were observed under a scanning electron microscope, the $L_{max}$ values of randomly selected 15 single crystals were 9.4 µm or more and 17.4 µm or less and the $L_{min}$ values thereof were 1.8 µm or more and 3.4 µm or less. The aspect ratios ($L_{max}/L_{min}$) were 4.0 to 8.5 and the average value was 5.7.

When x was 0.8 (Example 14), the rectangular parallelepiped-shaped single crystal of the present invention was obtained but an aggregate of the rectangular parallelepiped-shaped single crystals was simultaneously mixed. Since the aggregate is larger than the rectangular parallelepiped-shaped particles, the aggregate can be removed by classification. However, the yield of the rectangular parallelepiped-shaped single crystal in Example 14 was lower than that of Examples 15 to 18.

When x was 0.3 (Example 19), the rectangular parallelepiped-shaped single crystal containing sodium niobate as the main component of the present invention was obtained but cubic sodium niobate particles of 5 µm or less were simultaneously mixed. Since the cubic particles are smaller than the rectangular parallelepiped-shaped particles, the cubic particles can be removed by classification. However, the yield of the rectangular parallelepiped-shaped single crystal in Example 19 was lower than that of Examples 15 to 18.

Examples 20 and 21 and Comparative Example 7

Rectangular parallelepiped-shaped single crystals were produced by the same technique as that of Example 17, except the heat treatment temperature. Even when the holding temperature was changed in the range of 1235 to 1250° C., rectangular parallelepiped-shaped single crystals were able to be obtained. However, in Comparative Example 7 in which the heat treatment temperature was 1260° C., a sintered substance remained in the crucible, so that a rectangular parallelepiped-shaped single crystal was not obtained even after the process of removing water soluble components was performed.

Production of Oriented Ceramics

Comparative Example 8

Using the plate-like particles obtained in Comparative Example 1 as template grains, an oriented ceramics of $88NaNbO_3$-$12BaTiO_3$ was produced. The oriented ceramics was produced by a rolling method with reference to a literature. First, 17.5% by weight of polyvinyl butyral, 46.5% by weight of xylene, 31% by weight of 1-butanol, 2.5% by weight of dibutyl phthalate, and 2.5% by weight of liquid paraffin were mixed to produce a binder solution.

For the raw material powder, NaNbO3 having a particle diameter of about 100 nm and BaTiO3 powder were used as matrix grains and CuO powder having a particle diameter of 1 to 5 µm was added as a sintering aid.

5% of the total weight of the template grains and the matrix grains was used as the template grains.

The molar ratio of NaNbO3 to BaTiO3, which were the matrix grains, was 0.83:0.12. NaNbO3 and BaTiO3 were weighed in such a manner that the molar ratio of NaNbO3 to BaTiO3 was 0.88:0.12 when the template grains were added to the matrix grains.

The CuO was set to 0.0075 mol based on the total number of moles (1) of NaNbO3 and BaTiO3. The binder solution and a xylene-butanol mixed solution were added to the raw material powder, and then stirred to form a slurry. Then, the solvent was moderately evaporated to form the slurry into a clay-like sample.

By rolling the obtained clay-like sample, a green body was produced.

The rolling was carried out by adding the clay-like sample between two rollers having a parallel gap.

The rolling was carried out while gradually reducing the interval of the rollers to reach 1 mm from 3 mm set at first.

The temperature of the obtained green body was gradually increased over 1 week until the temperature reached 90° C. at the maximum in a drying room to remove volatile components contained in the green body.

Thereafter, WIP processing was performed at 80° C., the resultant green body was cut into a suitable shape, and then the cut green body was sintered in the electric furnace.

In the sintering process, the temperature was first increased to reach 450° C. from room temperature at a speed of 24° C./hour at the maximum, the temperature was then increased to 1000° C. at 300° C./hour, the substance was held for 1 hour, the temperature was further increased to 1200° C. at 300° C./hour, the substance was held for 6 hours, and then the sintered substance was cooled in the furnace.

The Lotgering factor of a sintered substance was evaluated to be 60% or less.

The composition analysis results showed that the sodium was deficient by more than 2% to the niobium.

Comparative Example 9

An oriented ceramics of 88NaNbO3-12BaTiO3 was produced by the same technique as that of Comparative Example 8. However, the plate-like particles obtained in Comparative Example 3 were used for the template grains. The Lotgering factor of a fired substance was evaluated to be smaller than 60%. The composition analysis results showed that the sodium was deficient by more than 2% to the niobium.

Examples 22 to 32

Using the rectangular parallelepiped-shaped single crystals obtained in Example 3 or Comparative Example 17, oriented ceramics of 88NaNbO3-12BaTiO3 (Examples 22 to 26, 30, and 31), 90NaNbO3-10BaTiO3 (Examples 27, 28, and 32), and 91NaNbO3-9BaTiO3 (Example 29) were produced by the same technique as that of Comparative Example 9. However, in the case of template grains and matrix grains, the types and the concentrations of additives were varied. In the case of adding Mn to additives, Mn3O4 powder was used for the raw material powder. The production conditions and the compositions and the Lotgering factors of the obtained oriented ceramics are collectively shown in Table 4. By the use of the plate-like particles of the present invention, the Lotgering factor of the obtained oriented ceramics increased to be larger than 70% and the deficient of the sodium to the niobium decreased to be smaller than 2%. As the composition analysis, each of the front surface and the back surface of the fired substance was ground by about 200μ, and then evaluated by wavelength dispersive fluorescent x-rays.

Next, a piezoelectric element of the present invention was produced.

Piezoelectric Element

Both the front surface and the back surface of an oriented ceramics of 88NaNbO3-12BaTiO3 having a Lotgering factor of more than 80% were polished, 400 nm thick gold electrodes were formed on the front surface and the back surface by a DC sputtering method. Between the electrodes and the piezoelectric material, a layer containing 30 nm thick titanium was formed as an adhesion layer. The piezoelectric material with the electrodes was cut to produce a strip-shaped element of 10 mm×2.5 mm×0.5 mm.

The element was placed on a hot plate having a surface temperature of 100 to 150° C., and then a 1.5 kV/nm electric field was applied between the electrodes for 30 minutes to perform the polarization processing. Thus, the piezoelectric element of the present invention was obtained in which the oriented ceramics of a portion sandwiched between the electrodes has remanent polarization vertical to the electrode plane.

TABLE 1

| | $Bi_2O_3$ (molar ratio: A) | x | $Bi_2O_3$ (molar ratio: Ax) | $Na_2CO_3$ (molar ratio: B) | $Nb_2O_5$ (molar ratio: C) | Sodium salt | Raw material/Salt (weight ratio) | Heat treatment temperature (° C.) | Heat treatment time (hour) | Crucible material | Single crystal |
|---|---|---|---|---|---|---|---|---|---|---|---|
| Ex. 1 | 5 | 0.6 | 3 | 9 | 12 | NaCl | 2.5 | 1225 | 6 | Pt | o |
| Ex. 2 | 5 | 0.5 | 2.5 | 9 | 12 | NaCl | 2.5 | 1225 | 6 | Pt | o |
| Ex. 3 | 5 | 0.4 | 2 | 9 | 12 | NaCl | 2.5 | 1225 | 6 | Pt | o |
| Ex. 4 | 5 | 0.3 | 1.5 | 9 | 12 | NaCl | 2.5 | 1225 | 6 | Pt | o |
| Ex. 5 | 5 | 0.4 | 2 | 9 | 12 | NaCl | 2.5 | 1235 | 6 | Pt | o |
| Ex. 6 | 5 | 0.4 | 2 | 9 | 12 | NaCl | 2.5 | 1225 | 6 | Pt | o |
| Ex. 7 | 5 | 0.4 | 2 | 9 | 12 | NaCl | 2.5 | 1215 | 6 | Pt | o |
| Ex. 8 | 5 | 0.4 | 2 | 9 | 12 | NaCl | 2.5 | 1200 | 6 | Pt | o |
| Ex. 9 | 5 | 0.4 | 2 | 9 | 12 | 9NaCl + 1NaF | 2.5 | 1225 | 6 | Pt | o |
| Ex. 10 | 5 | 0.4 | 2 | 9 | 12 | NaCl | 1.5 | 1225 | 6 | Pt | o |
| Ex. 11 | 5 | 0.4 | 2 | 9 | 12 | NaCl | 1 | 1225 | 6 | Pt | o |
| Ex. 12 | 5 | 0.4 | 2 | 9 | 12 | NaCl | 2.5 | 1225 | 12 | Pt | o |
| Ex. 13 | 5 | 0.9 | 4.5 | 9 | 12 | NaCl | 2.5 | 1225 | 6 | $Al_2O_3$ | o |
| Ex. 14 | 5 | 0.8 | 4 | 13 | 16 | NaCl | 2.5 | 1225 | 6 | Pt | o |
| Ex. 15 | 5 | 0.7 | 3.5 | 13 | 16 | NaCl | 2.5 | 1225 | 6 | Pt | o |
| Ex. 16 | 5 | 0.6 | 3 | 13 | 16 | NaCl | 2.5 | 1225 | 6 | Pt | o |
| Ex. 17 | 5 | 0.5 | 2.5 | 13 | 16 | NaCl | 2.5 | 1225 | 6 | Pt | o |
| Ex. 18 | 5 | 0.4 | 2 | 13 | 16 | NaCl | 2.5 | 1225 | 6 | Pt | o |
| Ex. 19 | 5 | 0.3 | 1.5 | 13 | 16 | NaCl | 2.5 | 1225 | 6 | Pt | o |
| Ex. 20 | 5 | 0.5 | 2.5 | 13 | 16 | NaCl | 2.5 | 1235 | 6 | Pt | o |
| Ex. 21 | 5 | 0.5 | 2.5 | 13 | 16 | NaCl | 2.5 | 1250 | 6 | Pt | o |
| Comp. Ex. 1 | 5 | — | 5 | 7 | 10 | — | — | — | — | — | x |
| Comp. Ex. 2 | — | — | 5 | 13 | 16 | — | — | — | — | — | x |

TABLE 1-continued

| | Bi₂O₃ (molar ratio: A) | x | Bi₂O₃ (molar ratio: Ax) | Na₂CO₃ (molar ratio: B) | Nb₂O₅ (molar ratio: C) | Sodium salt | Raw material/Salt (weight ratio) | Heat treatment temperature (° C.) | Heat treatment time (hour) | Crucible material | Single crystal |
|---|---|---|---|---|---|---|---|---|---|---|---|
| Comp. Ex. 3 | 5 | 0.33 | 1.65 | 7 | 10 | NaCl | 2.5 | 1225 | 6 | Pt | ○ |
| Comp. Ex. 4 | 5 | 0.4 | 2 | 9 | 12 | NaCl | 2.5 | 1150 | 6 | Pt | — |
| Comp. Ex. 5 | 5 | 0.4 | 2 | 9 | 12 | NaCl | 0.5 | 1225 | 6 | Pt | x |
| Comp. Ex. 6 | 5 | 0.4 | 2 | 9 | 12 | NaCl | 2.5 | 1225 | 0 | Pt | x |
| Comp. Ex. 7 | 5 | 0.5 | 2.5 | 13 | 16 | NaCl | 2.5 | 1260 | 6 | Pt | x |

TABLE 2

| | Molar ratio (Na/Nb) | Molar ratio (Bi/Nb) | $m_a$ | Constituent phase | $L_{max}$ (μm) | $L_{min}$ (μm) | $L_{max}/L_{min}$ |
|---|---|---|---|---|---|---|---|
| Comp. Ex. 3 | 0.77 | 0.11 | 6.0 | Perovskite structure | 10 to 20 | 4 to 6 | 1.7 to 5.0 |
| Ex. 3 | 0.82 | 0.095 | 6.4 | Perovskite structure | 10 to 20 | 2 to 5 | 2.0 to 15 |
| Ex. 17 | 0.87 | 0.11 | 7.0 | Perovskite structure | 10 to 20 | 2 to 4 | 2.5 to 10 |

TABLE 3

| Sample | Particles | Lmax | Lmin | Lmax/Lmin |
|---|---|---|---|---|
| Comp. Ex. 3 | 1 | 13.0 | 4.3 | 3.0 |
| | 2 | 16.9 | 5.5 | 3.1 |
| | 3 | 15.1 | 4.3 | 3.5 |
| | 4 | 14.7 | 4.1 | 3.5 |
| | 5 | 15.3 | 4.3 | 3.6 |
| | 6 | 17.5 | 4.5 | 3.9 |
| | Width | 13.0-17.5 | 4.1-5.5 | 3.0-3.9 |
| | Average | 15.4 | 4.5 | 3.4 |
| Ex. 2 | 1 | 14.1 | 3.3 | 4.2 |
| | 2 | 17.6 | 3.9 | 4.5 |
| | 3 | 12.9 | 2.8 | 4.6 |
| | 4 | 18.0 | 3.9 | 4.7 |
| | 5 | 16.5 | 3.3 | 4.9 |
| | 6 | 15.7 | 3.1 | 5.0 |
| | 7 | 15.0 | 2.9 | 5.1 |
| | 8 | 16.1 | 2.9 | 5.5 |
| | Width | 12.9-18.0 | 2.9-3.9 | 4.2-5.5 |
| | Average | 15.7 | 3.3 | 4.8 |
| Ex. 3 | 1 | 12.3 | 2.8 | 4.4 |
| | 2 | 12.9 | 2.8 | 4.6 |
| | 3 | 12.1 | 2.4 | 5.1 |
| | 4 | 17.2 | 3.3 | 5.2 |
| | 5 | 14.4 | 2.7 | 5.4 |
| | 6 | 20.0 | 3.7 | 5.5 |
| | 7 | 15.7 | 2.8 | 5.7 |
| | 8 | 17.9 | 2.9 | 6.2 |
| | 9 | 19.1 | 2.9 | 6.5 |
| | 10 | 15.2 | 2.2 | 6.8 |
| | 11 | 18.0 | 2.5 | 7.1 |
| | Width | 12.1-20.0 | 2.2-3.7 | 4.4-7.1 |
| | Average | 15.9 | 2.8 | 5.7 |
| Ex. 16 | 1 | 13.0 | 3.1 | 4.3 |
| | 2 | 11.1 | 2.6 | 4.3 |
| | 3 | 13.6 | 2.2 | 6.1 |
| | 4 | 15.2 | 2.5 | 6.2 |
| | 5 | 13.1 | 1.8 | 7.3 |
| | Width | 11.1-15.2 | 1.8-3.1 | 4.3-7.3 |
| | Average | 13.2 | 2.4 | 5.6 |
| Ex. 17 | 1 | 9.4 | 2.4 | 4.0 |
| | 2 | 12.9 | 3.2 | 4.1 |
| | 3 | 14.1 | 3.4 | 4.1 |
| | 4 | 11.5 | 2.8 | 4.1 |
| | 5 | 12.0 | 2.9 | 4.1 |
| | 6 | 10.4 | 2.2 | 4.7 |
| | 7 | 16.0 | 2.9 | 5.5 |
| | 8 | 14.8 | 2.6 | 5.6 |
| | 9 | 11.0 | 1.8 | 6.1 |
| | 10 | 11.4 | 1.8 | 6.5 |
| | 11 | 17.1 | 2.5 | 6.7 |
| | 12 | 12.5 | 1.8 | 7.0 |
| | 13 | 16.7 | 2.4 | 7.1 |
| | 14 | 16.4 | 2.2 | 7.5 |
| | 15 | 17.4 | 2.0 | 8.5 |
| | Width | 9.4-17.4 | 1.8-3.4 | 4.0-8.5 |
| | Average | 13.6 | 2.5 | 5.7 |

TABLE 4

| Sample | Used plate-like particles | Plate-like particle amount (% by mass) | Matrix grain amount (% by mass) | Na (% by mol) | Nb (% by mol) | Ba (% by mol) | Ti (% by mol) | Na/Nb (Molar ratio) | Ba/Ti (Molar ratio) | Bi (% by mol) | Additives | Additive concentration (% by mol) | Lotgering factor (%) |
|---|---|---|---|---|---|---|---|---|---|---|---|---|---|
| Comp. Ex. 8 | Comp. Ex. 1 | 5 | 95 | 87 | 88 | 12 | 12 | 0.97 | 1.0 | 0.4 | CuO | 0.75 | <60 |

TABLE 4-continued

| Sample | Used plate-like particles | Plate-like particle amount (% by mass) | Matrix grain amount (% by mass) | Na (% by mol) | Nb (% by mol) | Ba (% by mol) | Ti (% by mol) | Na/Nb (Molar ratio) | Ba/Ti (Molar ratio) | Bi (% by mol) | Additives | Additive concentration (% by mol) | Lotgering factor (%) |
|---|---|---|---|---|---|---|---|---|---|---|---|---|---|
| Comp. Ex. 9 | Comp. Ex. 3 | 5 | 95 | 85 | 88 | 12 | 12 | 0.97 | 1.0 | 0.5 | CuO | 0.75 | <60 |
| Ex. 22 | Ex. 3 | 5 | 95 | 87 | 88 | 12 | 12 | 0.99 | 1.0 | 0.4 | CuO | 0.75 | >70 |
| Ex. 23 | Ex. 3 | 5 | 95 | 87 | 88 | 12 | 12 | 0.99 | 0.99 | 0.4 | CuO | 0.5 | >80 |
| Ex. 24 | Ex. 3 | 5 | 95 | 87 | 88 | 12 | 12 | 0.99 | 1.0 | 0.4 | CuO | 0.2 | >80 |
| Ex. 25 | Ex. 3 | 5 | 95 | 87 | 88 | 12 | 12 | 0.99 | 1.0 | 0.4 | CuO | 0.1 | >80 |
| Ex. 26 | Ex. 3 | 2 | 98 | 88 | 88 | 12 | 12 | 1.0 | 1.0 | 0.2 | CuO | 0.2 | >85 |
| Ex. 27 | Ex. 3 | 2 | 98 | 89 | 90 | 10 | 10 | 0.99 | 1.0 | 0.2 | CuO | 0.2 | >85 |
| Ex. 28 | Ex. 17 | 2 | 98 | 90 | 90 | 10 | 10 | 1.0 | 1.0 | 0.2 | CuO | 0.2 | >85 |
| Ex. 29 | Ex. 3 | 2 | 98 | 90 | 91 | 10 | 10 | 0.99 | 1.0 | 0.2 | CuO | 0.2 | >85 |
| Ex. 30 | Ex. 3 | 1 | 99 | 87 | 88 | 12 | 12 | 0.99 | 1.0 | 0.1 | CuO | 0.2 | >85 |
| Ex. 31 | Ex. 3 | 2 | 98 | 87 | 88 | 12 | 12 | 0.99 | 1.0 | 0.2 | MnO2 | 0.2 | >85 |
| Ex. 32 | Ex. 3 | 2 | 98 | 89 | 90 | 10 | 10 | 0.99 | 1.0 | 0.2 | MnO2 | 0.1 | >85 |

According to the method for manufacturing a rectangular parallelepiped-shaped single crystal of the present invention, a rectangular parallelepiped-shaped single crystal containing sodium niobate of a perovskite structure as the main component is obtained. The rectangular parallelepiped-shaped single crystal can be utilized for the production of an oriented ceramics as a template grain. By a one-stage molten salt synthesis simpler than a former two-stage molten salt synthesis, a rectangular parallelepiped-shaped single crystal in which sodium deficiency is suppressed can be produced. The rectangular parallelepiped-shaped single crystal can be utilized for the orientation control of a piezoelectric ceramics containing sodium niobate as a component to markedly improve the piezoelectric performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-054051, filed Mar. 17, 2015, which is hereby incorporated by reference herein in its entirety.

What is claimed is:

1. A rectangular parallelepiped-shaped single crystal containing sodium niobate of a perovskite structure as a main component, wherein
the rectangular parallelpiped-shaped single crystal contains bismuth in an amount of 0.05 mol or more and 0.15 mol or less per mole of the sodium niobate,
a Na/Nb ratio of the rectangular parallelepiped-shaped single crystal is 0.82 or more and 1.00 or less, and
a ratio of a longest side length ($L_{max}$) to a shortest side length ($L_{min}$) of the rectangular parallelepiped is in a range of $L_{max}/L_{min}$ of $4.0 \leq L_{max}/L_{min} \leq 8.5$.

2. The rectangular parallelepiped-shaped single crystal containing sodium niobate as a main component according to claim 1, wherein the $L_{max}$ is 9.4 μm or more and 20 μm or less.

3. Ceramics, which is obtained by sintering a green body containing the rectangular parallelepiped-shaped single crystal containing sodium niobate as a main component according to claim 1.

4. The ceramics according to claim 3, wherein the ceramics is oriented in a (110) plane or a (001) plane.

5. A piezoelectric element, comprising:
a first electrode;
a piezoelectric material portion; and
a second electrode, wherein a piezoelectric material configuring the piezoelectric material portion is the ceramics according to claim 4.

6. A piezoelectric device, comprising:
the piezoelectric element according to claim 5; and
at least one of a voltage application unit to the piezoelectric element and a power extracting unit from the piezoelectric element.

7. An electronic device;
comprising the piezoelectric element according to claim 5.

8. A rectangular parallelepiped-shaped single crystal powder, comprising:
a plurality of rectangular parallelepiped-shaped single crystals according to claim 1.

* * * * *